(12) United States Patent
Summerer

(10) Patent No.: US 6,537,836 B2
(45) Date of Patent: Mar. 25, 2003

(54) SEMICONDUCTOR STRUCTURES AND MANUFACTURING METHODS

(75) Inventor: Christian Summerer, Fishkill, NY (US)

(73) Assignee: Infineon Technologies AG, Munich (DE)

(*) Notice: Subject to any disclaimer, the term of this patent is extended or adjusted under 35 U.S.C. 154(b) by 113 days.

(21) Appl. No.: 09/733,666

(22) Filed: Dec. 8, 2000

(65) Prior Publication Data

US 2002/0018206 A1 Feb. 14, 2002

Related U.S. Application Data

(62) Division of application No. 09/362,976, filed on Jul. 28, 1999, now abandoned.

(51) Int. Cl.[7] .................. H01L 21/00; G01N 21/86; G01B 11/00
(52) U.S. Cl. .................. 438/16; 438/14; 438/401; 438/462; 257/797; 257/798; 250/548; 250/557; 356/401
(58) Field of Search .................. 257/797, 798; 438/401, 462, 975, 16, 14; 356/400, 401; 250/548, 557; 355/53, 54, 67, 69; 430/22, 312, 328

(56) References Cited

U.S. PATENT DOCUMENTS 5,477,057 A * 12/1995 Angeley et al. ............ 250/548
5,601,957 A    2/1997  Mizutani et al. ............ 430/22
5,861,320 A *  1/1999  Shiraishi ..................... 438/16
6,118,516 A *  9/2000  Irie et al. ................... 355/53
6,132,910 A * 10/2000  Kojima ....................... 430/22
6,151,102 A * 11/2000  Nishi ......................... 250/584
6,228,743 B1 * 5/2001  Chen et al. ................ 257/797
6,339,471 B1 * 1/2002  Morita ...................... 250/492.2

FOREIGN PATENT DOCUMENTS

JP          54037473         3/1979

* cited by examiner

Primary Examiner—Tom Thomas
Assistant Examiner—Donghee Kang
(74) Attorney, Agent, or Firm—Daly, Crowley & Mofford, LLP

(57) ABSTRACT

A semiconductor body having an alignment mark comprising a pair of sets of parallel lines disposed on the semiconductor body, the parallel lines in one of the sets being disposed orthogonal to the parallel lines in the other one of the set, the two sets of parallel lines being in an overlaying relationship. Also, a method and apparatus for detecting an alignment mark on a semiconductor body. The method and apparatus provide an alignment illumination comprising a pair of orthogonal, lines of impinging light which is scanned over the surface of the alignment mark, one of such pair of impinging light lines being orthogonal to, and laterally displaced from, the other one of such pair of impinging light lines, impinging light being reflected by the alignment lines in the surface of the semiconductor when such impinging light is over to provide a pair of laterally displaced beams of reflected light. The method includes detecting in a each one of a pair of laterally spaced detectors a corresponding one of the laterally displaced beams of reflected light.

1 Claim, 3 Drawing Sheets

SEMICONDUCTOR STRUCTURES AND MANUFACTURING METHODS

This is a divisional, of application Ser. No. 09/362,976 filed Jul. 28, 1999, now abandoned.

BACKGROUND OF THE INVENTION

This invention relates generally to semiconductor structures and manufacturing methods and more particularly to alignment techniques used therein.

As is known in the art, semiconductor integrated circuits are manufactured using a series of process steps which require proper alignment of the semiconductor wafer. Many alignment systems use reflected light from profile patterns formed on the surface of the semiconductor wafer to determine the location of the wafer. Such an arrangement is shown in FIG. 1. An alignment illumination 10, here a cross, is focused onto the surface 12 of the semiconductor wafer 14 using an optical system 16. A portion of the light is reflected from the surface of the semiconductor wafer is directed by the optical system 16 to a detector arrangement 20. The wafer 14 has formed along one portion thereof an alignment mark 22, here shown diagrammatically as a series of grooves 24 etched into the surface 12 of the wafer 14. As the wafer 14 is scanned horizontally, the detector arrangement 20 produces waveforms which enable detection of the alignment of the wafer 14 relative to the optical system 16.

More particularly, and referring also to FIG. 2, there are shown four sites, i.e., site 1, site 2, site 3 and site 4 of alignment marks on each of both the upper and lower peripheral portions of a semiconductor wafer 14. Each one of the sites includes two sets of lines 13, one at +45 degrees with respect to the vertical, or Y axis, and the other set of lines 15 being at −45 degrees with respect to the Y axis. The alignment illumination projected by the optical system (FIG. 1) onto the surface of the wafer is a cross, such as used in the MICRASCAN equipment manufactured by Silicon Valley Group (SVG), San Jose, Calif. A "standard" alignment mark, in one half of a site, for the MICRASCAN III equipment is shown in FIG. 3 and consists of wide stripes at a 45 degree angle separated by variable spacing. Another version is shown in FIG. 4 and is made up of lines at the locations where the "standard" mark has the edges of its stripes. The size of both versions is 60×60 micrometers. The alignment marks etched into the surface of the wafer are shown in FIG. 2 as a pair orthogonal sets of a series of parallel lines, only one of the two sets being shown in FIGS. 3 and 4.

Referring again to FIG. 1, the alignment illumination, a cross is projected onto the surface 12 of wafer 14 with the pair of intersecting arms of the cross being disposed nominally orthogonal to the lines in each of the sites. The cross-shaped light (i.e., the alignment illumination) is projected by the optical system 16 onto, and scanned across the site (FIG. 2) along the X direction indicated on the surface 12 of the wafer 14. The optical system 16 includes a prism (FIG. 1) which directs a portion of the light reflected surface 12 of the wafer 14 onto a detector arrangement 20 shown diagrammatically in FIG. 1. Thus, as indicated, there are four detectors $22_1$, $22_2$, $22_3$, and $22_4$; one pair $22_1$ and $22_2$ being disposed along an axis +45 degrees with respect to the Y axis and one pair $22_3$ and $22_4$ being disposed along an axis −45 degrees with respect to the Y axis. The pair of detectors $22_1$, (i.e., "Left +45") and $22_2$ (i.e., "Right +45") is used for detection of light reflected by lines 13 at +45 degrees with respect to the Y axis and the pair of detectors $22_3$ (i.e., "Left −45") and $22_4$ (i.e., "Right −45") are used to detect light reflected by lines 15 at −45 degrees with respect to the Y axis.

More particularly, to determine the location of an alignment site, two marks 13, 15 (FIG. 1); one oriented at +45 degrees and one at −45 degrees with respect to the Y axis, are required. The alignment marks 13, 15 are scanned by the optical system with an X shaped illumination, as described above. The light reflected from the surface of the wafer and the alignment lines is detected in the dark field mode, i.e., only light scattered from the marks at an angle is analyzed. Two detectors $22_1$ and $22_2$ record simultaneously the reflected light; one detector $22_2$ located to the right side and one detector $22_1$ to the left side of the mark's edge. When scanning the +45 degree lines 13, the set of detectors $22_1$ and $22_2$ is activated and when the −45 degree lines 15 are scanned, the set of detectors $22_3$, $22_4$ are activated. More particularly, referring to FIG. 1, when the alignment illumination is over the +45 degree lines 13 of site 1, the "Left +45" and "Right +45" detectors $22_1$ and $22_2$ are activated and the "Left −45" and "Right −45" detectors $22_3$ and $22_4$, are deactivated. When the alignment illumination moves over the −45 degree lines 15 of site 1, the "Left −45" and "Right −45" detectors $22_3$ and $22_4$ are activated and the "Left +45" and "Right +45" detectors $22_1$ and $22_2$ are deactivated. It is noted that with such an arrangement, each alignment site is made up of a pair of spatially separated sets 13, 15 of parallel orthogonal lines with two sets in the site being sequentially activated/deactivated detectors. Such spatial separation increases the area required for an alignment site.

SUMMARY OF THE INVENTION

In accordance with the present invention, a semiconductor body is provided having an alignment mark comprising a pair of sets of parallel lines disposed on the semiconductor body, the parallel lines in one of the sets being disposed orthogonal to the parallel lines in the other one of the set, the two sets of parallel lines being in an overlaying relationship.

With such structure, the same amount of wafer surface area enables twice as many alignment sites. Thus, the arrangement allows the alignment system to acquire twice the amount of metrology information during the same alignment scanning process to thereby increase the alignment quality. Further, there is no loss of through-put because the same time is used for scanning the sites as in the system described above.

In accordance with another embodiment, a method is provided for detecting an alignment mark on a semiconductor body. The method includes providing the alignment mark on the semiconductor body, such alignment mark comprising a pair of sets of parallel lines disposed on the semiconductor body, the parallel lines in one of the sets being disposed orthogonal to the parallel lines in the other one of the set, the two sets of parallel lines being in an overlaying relationship. The alignment illumination comprising a pair of orthogonal, lines of impinging light is scanned over the surface of the alignment mark, one of such pair of impinging light lines being orthogonal to, and laterally displaced from, the other one of such pair of impinging light lines, impinging light being reflected by the alignment lines in the surface of the semiconductor when such impinging light is over to provide a pair of laterally displaced beams of reflected light. The method includes detecting in each one of a pair of laterally spaced detectors a corresponding one of the laterally displaced beams of reflected light.

In accordance with another embodiment of the invention, apparatus is provided for detecting an alignment mark on a semiconductor body, such alignment mark. The alignment mark comprises a pair of sets of parallel lines disposed on the semiconductor body, the parallel lines in one of the sets being disposed orthogonal to the parallel lines in the other one of the set, the two sets of parallel lines being in an overlaying relationship. The apparatus includes an optical system for scanning an alignment illumination comprising a pair of orthogonal, lines of impinging light over the surface of the alignment mark, one of such pair of impinging light lines being orthogonal to, and laterally displaced from, the other one of such pair of impinging light lines, impinging light being reflected by the alignment lines in the surface of the semiconductor when such impinging light is over to provide a pair of laterally displaced beams of reflected light. The apparatus also includes a pair of laterally spaced detectors, each one of the detectors being positioned to detect a corresponding one of the laterally displaced beams of reflected light.

BRIEF DESCRIPTION OF THE DRAWING

These and other features of the invention will become more readily apparent from the following detailed description when read together with the accompanying drawings, in which.

DESCRIPTION OF THE PREFERRED EMBODIMENTS

Figure 1:
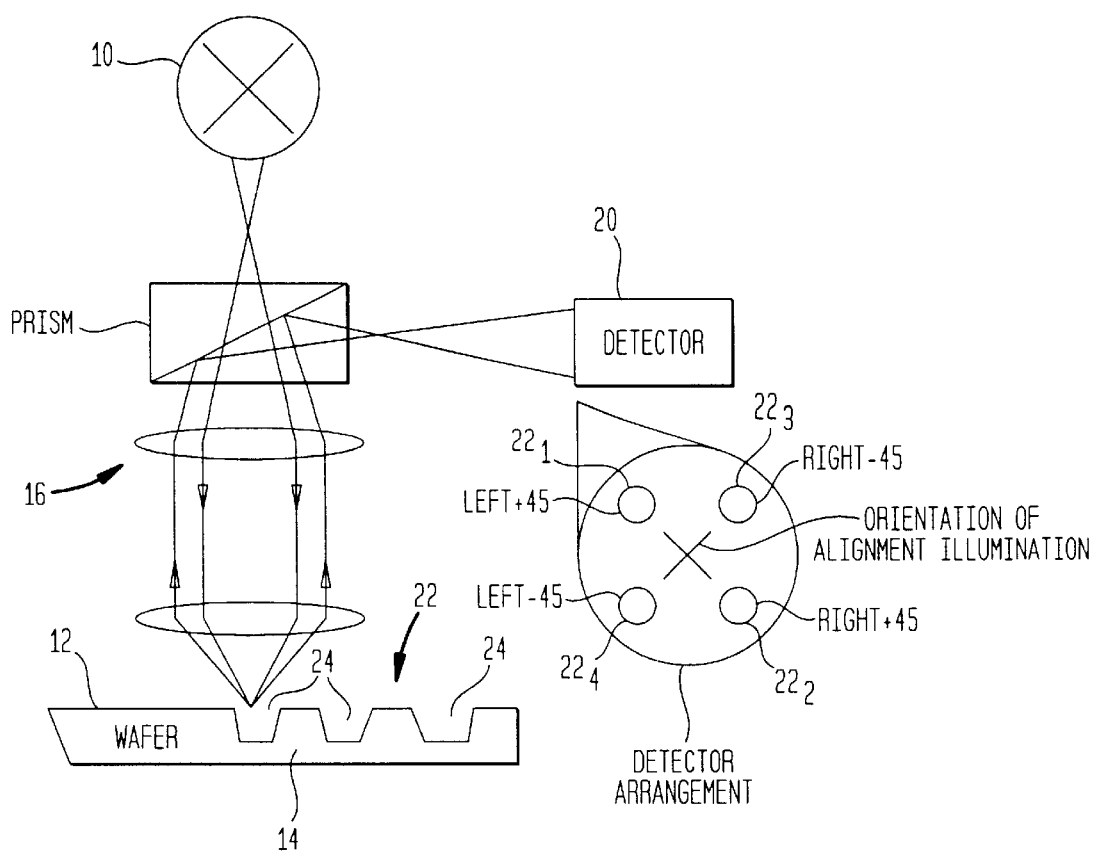
FIG. 1 is schematic diagram of an alignment system according to the PRIOR ART.
Figure 2:
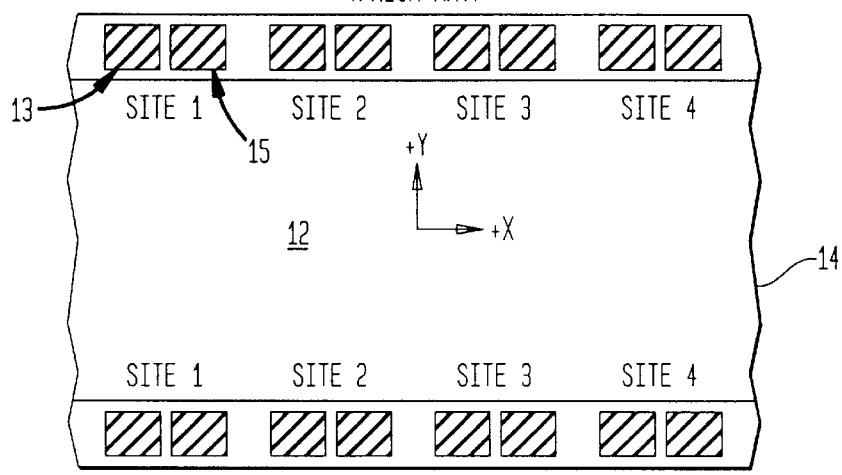
FIG. 2 is a plan view of a semiconductor wafer having alignment marks according to the PRIOR ART etched into such surface.
Figure 3:
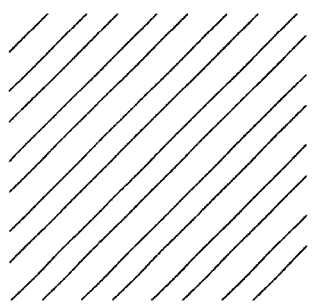
FIGS. 3 and 4 are sketches of alignment marks according to the PRIOR ART.
Figure 4:
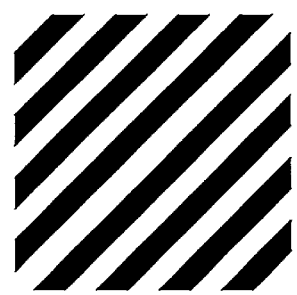
Figure 5:
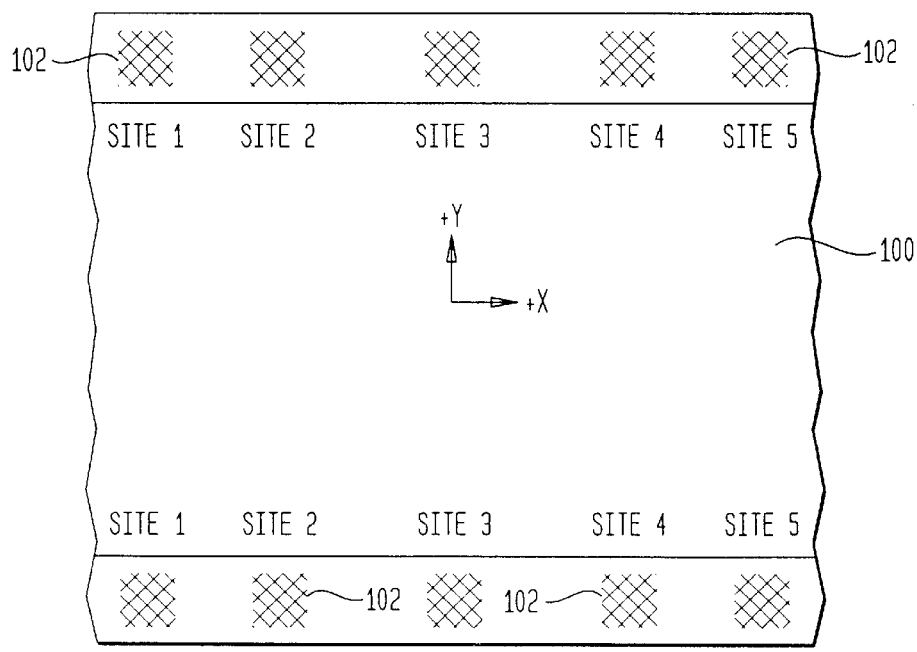
FIG. 5 is a plan view of a semiconductor wafer having alignment marks according to the invention etched into such surface.

Referring now to FIG. 5, a portion of a semiconductor body 100, here a single crystal silicon body is shown having formed thereon an the alignment sites, five sites (i.e., site 1, site 2, site 3, site 4 and site 5) along the top outer peripheral portion of the wafer and five sites (i.e., site 1, site 2, site 3, site 4, and site 5) along the lower outer peripheral portion. Each one of the sites is identical, an exemplary one thereof being shown in detail in FIG. 6. It is noted that the alignment site includes a single, composite alignment mark 102. The alignment mark 102, as noted above, is formed in a portion of the surface 104 of the semiconductor body 102, here as grooves 106. The surface 104 of the semiconductor body 102 is adapted to reflect light energy impinging on such surface with a predetermined wavelength.

More particularly, the semiconductor body 100 has an alignment mark 102 comprising a pair of sets of parallel lines 112, 114 (FIG. 6) disposed on the semiconductor body 100, the parallel lines 112 in one of the sets being disposed orthogonal to the parallel lines 114 in the other one of the set, the two sets of parallel lines 112, 114 being in an overlaying relationship to provide a composite mark at each one of the sites (FIG. 5).

Figure 6:
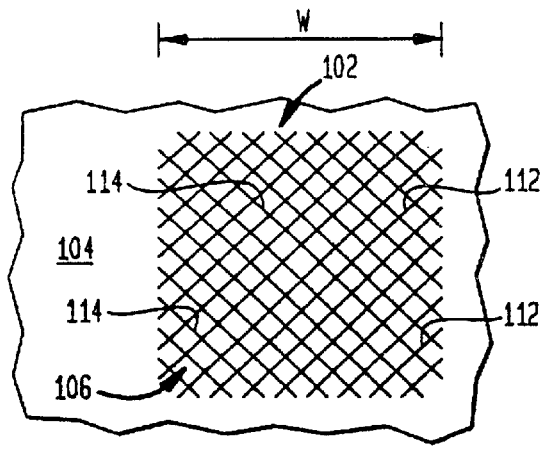
FIGS. 6 and 7 are sketches of alignment marks according to the invention.
Figure 8:
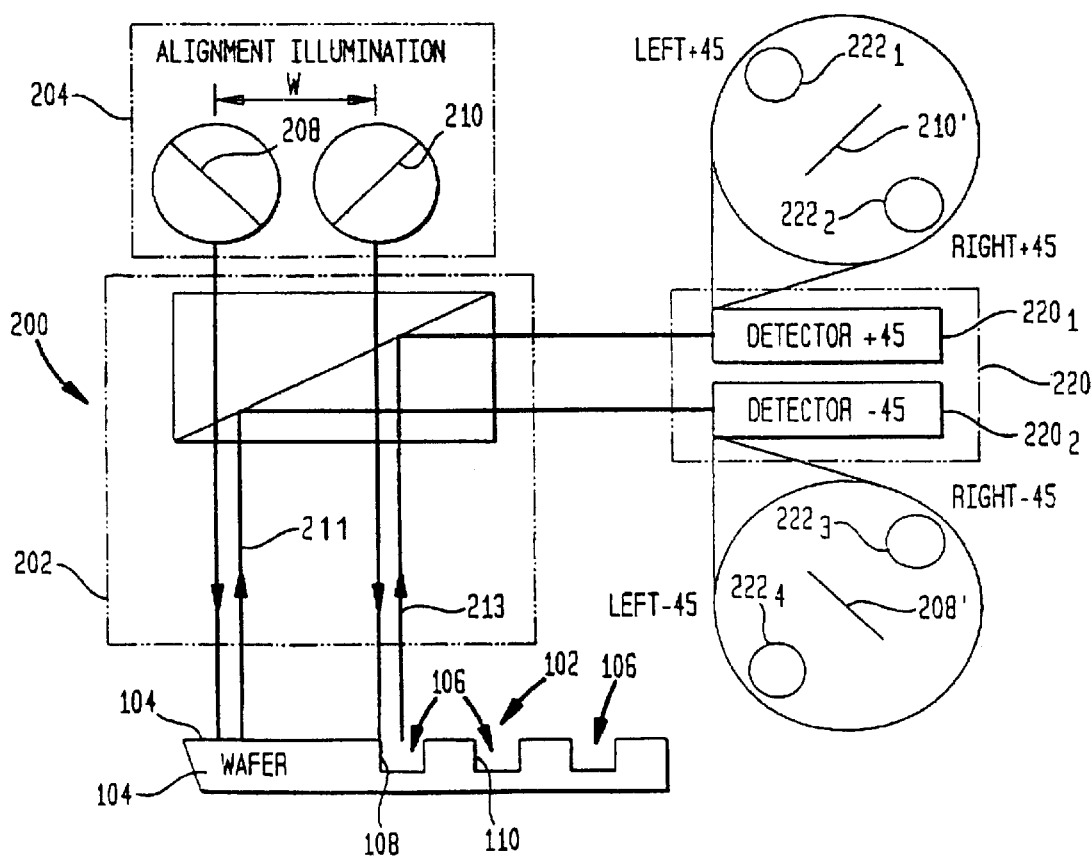
FIG. 8 is schematic diagram of an alignment system according to the invention, such system being adapted for use with a semiconductor wafer having the alignment marks shown in either FIG. 6 or FIG. 7.

Apparatus 200 shown in FIG. 8 is provided for detecting the alignment mark 102 (FIG. 6) on a semiconductor body 110. As noted above, the alignment mark 102 comprises a pair of sets of parallel lines 112, 114 (FIG. 6) disposed on the semiconductor body 100. The parallel lines 112, 114 in one of the sets is disposed orthogonal to the parallel lines 112, 114 in the other one of the sets. The alignment mark 102 includes, as noted above, grooves 106 having sidewalls 108 terminating at the surface 104 of the semiconductor body 100, as indicated in FIG. 8. The grooves 106 have bottom portions 110 recessed into the surface portion of the semiconductor body 100. The two sets of parallel lines 112, 114 are in an overlaying relationship. The apparatus 200 includes an optical system 202 for scanning an alignment illumination 204 comprising a pair of orthogonal, laterally displaced, along the X axis, lines 208, 210 of impinging light over the surface of the alignment mark 102. One of the pair of impinging light lines, here line 208, is orthogonal to, and laterally displaced from, the other one of such pair of impinging light lines 210. Here, the line 210 is projected onto the surface of the wafer 100 at an angle of −45 degrees with respect to the Y axis (FIG. 5) and the line 208 is projected onto the surface of the wafer 100 at an angle of +45 degrees with respect to the Y axis (FIG. 5). The impinging light (i.e., the alignment illumination) is reflected by the surface of the semiconductor body 100 when such impinging light is over the composite alignment mark 102 to provide a corresponding pair of laterally displaced beams 211, 213 of reflected light. The apparatus includes a detector arrangement 220. The detector arrangement 220 includes a pair of detectors configurations $220_1$ and $220_2$. The projected beams 211, 213 are directed by the optical system 200 to the detector configurations $220_1$ and $220_2$, respectively, as indicated. The detector configuration $220_1$ includes a pair of detectors $222_1$ and $222_2$, shown in FIG. 8. Shown diagrammatically with the detectors $222_1$ and $222_2$ is the projection of the illumination 210 (i.e., 210') if the surface of the wafer 100 were perfectly flat. Thus, detectors $222_1$ and $222_2$ are positioned to detect energy reflected by lines 112 (FIG. 6).

In like manner, the detector configuration $220_2$ includes a pair of detectors $222_3$ and $222_4$, shown in FIG. 8. Shown diagrammatically with the detectors $222_3$ and $222_4$ is the projection of the illumination 208 (i.e., 208') if the surface of the wafer 100 were perfectly flat. Thus, detectors $222_3$ and $222_4$ are positioned to detect energy reflected by lines 114 (FIG. 6).

With such apparatus, the alignment illumination is scanned over the surface of the alignment mark 102, one of such pair of impinging light lines 108 being orthogonal to, and laterally displaced from, the other one of such pair of impinging light lines 110, impinging light being reflected by the alignment lines in the surface of the semiconductor when such impinging light is over to provide a pair of laterally displaced beams 211, 213 lines of reflected light. The detectors $222_1$, $222_2$, $222_3$ and $222_4$ detect in each one of a pair of laterally spaced detector configurations $220_1$, $220_2$, respectively, a corresponding one of the laterally displaced beams 211, 213 of reflected light. The −45 degree and +45 degree oriented alignment lines 208, 210, respectively, of the cross-shaped alignment illumination 204 are separated locally by at least the width W (FIGS. 6 and 8) of the alignment mark 102. This will result in the alignment mark being scanned first by the +45 degree line 208 and subsequently by the −45 degree line 210. This arrangement allows the separation of the alignment detectors $222_1$, $222_2$ and $222_3$, $222_4$ for +45 degree and −45 degree orientations, respectively. As a result, each signal, or waveform, produced by the detectors can be recorded without background noise from the other line orientation.

Figure 7:
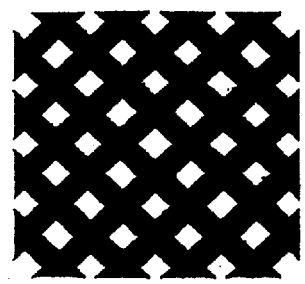

Other embodiments are within the spirit and scope of the appended claims. For example, other types of composite alignment marks may be used such as shown in FIG. 7.

What is claimed is:

1. A method for detecting an alignment mark on a semiconductor body, comprising:

providing the alignment mark on the semiconductor body, such alignment mark comprising a pair of sets of parallel lines disposed on the semiconductor body, the parallel lines in one of the sets being disposed orthogonal to the parallel lines in the other one of the set, the two sets of parallel lines being in an overlaying relationship;

scanning an alignment illumination comprising a pair of orthogonal, lines of impinging light over the surface of the alignment mark, one of such pair of impinging light lines being orthogonal to, and laterally displaced from, the other one of such pair of impinging light lines, impinging light being reflected by the alignment lines in the surface of the semiconductor when such impinging light is over to provide a pair of laterally displaced beams of reflected light; and detecting in a each one of a pair of laterally spaced detectors a corresponding one of the laterally displaced beams of reflected light.

* * * * *